United States Patent [19]

Beyer et al.

[11] Patent Number: 5,232,866
[45] Date of Patent: Aug. 3, 1993

[54] ISOLATED FILMS USING AN AIR DIELECTRIC

[75] Inventors: Klaus D. Beyer, Poughkeepsie; Victor J. Silvestri, Hopewell Junction; Andrie S. Yapsir, Pleasant Valley, all of N.Y.

[73] Assignee: International Business Machines Corporation, Armonk, N.Y.

[21] Appl. No.: 781,437

[22] Filed: Oct. 23, 1991

[51] Int. Cl.⁵ .............................................. H01L 21/76
[52] U.S. Cl. ...................................... 437/62; 437/927; 156/655
[58] Field of Search ............... 148/DIG. 73, DIG. 86, 148/DIG. 152, DIG. 159; 437/62, 228, 233, 921, 927; 156/643, 644, 648, 655, 657

[56] References Cited

U.S. PATENT DOCUMENTS

| | | | |
|---|---|---|---|
| 4,502,913 | 5/1985 | Lechaton et al. | 156/643 |
| 4,661,832 | 4/1987 | Lechaton et al. | 357/49 |
| 4,888,300 | 12/1989 | Burton | 437/61 |
| 4,925,805 | 5/1990 | Van Ommen et al. | 437/927 |

FOREIGN PATENT DOCUMENTS

| | | | |
|---|---|---|---|
| 61-180447 | 8/1986 | Japan | 437/62 |
| 61-198743 | 9/1986 | Japan | 437/62 |
| 2-222160 | 9/1990 | Japan | 437/62 |
| 3-71651 | 3/1991 | Japan | 437/62 |
| 2156149 | 10/1985 | United Kingdom | 437/62 |

OTHER PUBLICATIONS

"A New SOI Fabrication Technique for Ultrathin Active Layer of Less Than 89 nm", by Horie, et al., 1990 Symposium on VLSI Technology.

Primary Examiner—George Fourson
Attorney, Agent, or Firm—Richard Romanchik; Michael J. Balconi-Lamica

[57] ABSTRACT

A method for isolating a film from a substrate 50 includes the steps of: providing an N+ layer 52 on the substrate 50; forming an insulation layer 54 onto the N+ doped layer 52; etching a pair of trenches 56, 58 through the insulation layer 52 to thereby form an isolation region 60 of insulation material; laterally etching a cavity 62 underneath the isolation region; and, forming a film 64 onto the isolation region.

9 Claims, 2 Drawing Sheets

ISOLATED FILMS USING AN AIR DIELECTRIC

TECHNICAL FIELD

The present invention is related to the isolation techniques on a silicon chip, and more particularly, to the complete isolation of films from a substrate material utilizing air as a dielectric.

BACKGROUND ART

It is well known in the art to isolate regions of silicon from one another on a silicon substrate for the purpose of making active devices in the isolated regions. Early attempts at completely isolating these regions involve lateral isolation techniques by forming a trench around an island of semiconductor material to be isolated and filling the trench with an insulating material such as oxide. An example of this technique can be found in commonly owned U.S. Pat. No. 4,661,832 (Lechaton, et al.).

More recent techniques for isolating regions of semiconductor material have been accomplished by completely isolating the regions not only laterally from adjacent areas but also vertically from the substrate from which it is supported. Examples of this isolation technique can be found in U.S. Pat. No. 4,888,300 (Burton) and "A New SOI Fabrication Technique for Ultrathin Active Layer of Less the 80 nm" by H. Horie, K. Oikawa, H. Ishiwari, T. Yamazaki and S. Ando; Fujitsu Laboratories, Ltd.; 1990 Symposium on VLSI Technology IEEE (Horie, et al.).

Burton teaches a method of isolating active semiconductor regions by utilizing the different etch responsiveness of a buried region in order to form a submerged wall insulating layer between a substrate and an active area. After a standard buried layer has been formed in the substrate through conventional techniques, (e.g., epitaxial processing), a trench is cut into the epitaxial layer to provide access to the buried layer. Then, while suspending in place the portion of the epitaxial layer surrounded by the trench, (by means of an oxide bridge), the underlining region of the buried layer is etched away to form a cavity under the active area. This cavity, as well as the surrounding trench, is filled with a suitable insulating material to thereby completely isolate the active island from this substrate. An example of a suitable insulating material taught by Burton is polysilicon.

A similar isolation technique is disclosed by Horie, et al.

Although the "floating island" technique taught by Burton and Horie, et al. for isolating semiconductor regions is superior to earlier isolation methods, it is not without problems which render it ineffective. In particular, polysilicon trench structures having an oxide trench sidewall as taught by Burton and Horie, et al. produce a tremendous amount of thermal stress at the interface of the trench or cavity wall and the semiconductor substrate. This stress is manifested in silicon areas by stress induced dislocations which begin at vertical silicon/trench or cavity interfaces and extend into adjacent isolated silicon regions. The structural integrity of the isolated silicon region due to these dislocations is consequently compromised, rendering devices built thereon unreliable.

In addition to the above mentioned problem caused by stress induced dislocations, the isolated silicon region is subject to separation problems caused by the formation of oxide wedges resultant from subsequent oxidation steps performed to build devices into or onto the isolated silicon region. This occurs because the only exposed areas along the interface between the isolated silicon region and the support structure underneath is at the junction where the vertical walls of the isolated silicon region meets the supporting structure. These oxide wedges compress the isolated silicon region upwards or vertically, and consequently cause additional stress dislocations.

For the above reasons it has been found that the techniques of Burton and Horie, et al. are unacceptable for manufacturing processes. An isolation system which overcomes these deficiencies is therefore highly desirable.

DISCLOSURE OF THE INVENTION

An object of the present invention is to provide for isolation of films from a surrounding substrate.

According to the present invention, a technique for isolating films from a substrate includes the steps of: providing a N+ layer on a silicon substrate; forming an insulation layer onto the substrate; etching a pair of trenches through the insulation to the N+ layer to form a desired region of insulation for isolation; laterally etching through the N+ layer underneath the desired region, thereby isolating it from the substrate by air; and, forming a film, such as a metal or other conductive layer onto the desired region.

The present invention provides for complete isolation of films. The films are suspended by an insulation layer over an air dielectric, and; therefore, are not susceptible to thermal stress during subsequent processing. Furthermore, a significant portion of the present invention can be produced in the same tool as other processing steps, thereby making it economical compared to prior isolation techniques. The present invention can be customized with insulated structures limited to certain areas of a chip. In addition, insulated structures can be formed at different silicon depths to thereby optimize the isolation application for BiCMOS devices and Bipolar devices.

These and other objects, features and advantages of the present invention become more apparent in light of the detailed description of exemplary embodiments thereof as illustrated by the drawings.

BEST MODE FOR CARRYING OUT THE INVENTION

Figure 1A:
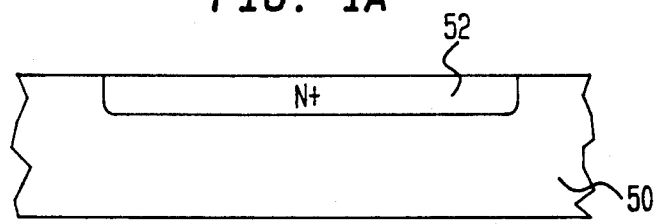
FIGS. 1A-1E are cross sectional views of the steps for producing an isolated film in accordance with the present invention.

Referring now to FIG. 1A, the present invention begins with a substrate 50, such as P− or N− doped silicon, having a N+ layer 52 provided therein. This layer 52 can be formed using conventional techniques known in the art, for example, by arsenic implantation with a subsequent drive in, or by selectively growing the N+ layer using epitaxial techniques.

Figure 1B:
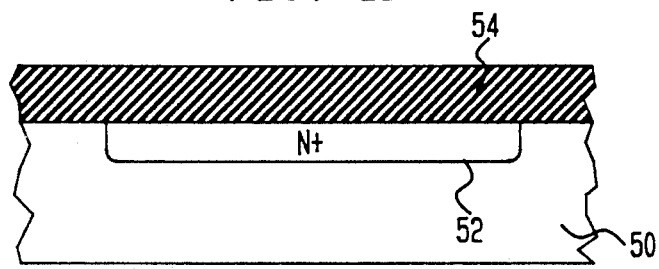

Referring now to FIG. 1B, next, an insulation layer 54 of an insulation material, such as an oxide, is formed onto the substrate 50 and layer 52 in a manner well known in the art. An example of a suitable deposition technique for this is CVD deposition or by thermal oxidation.

Figure 1C:
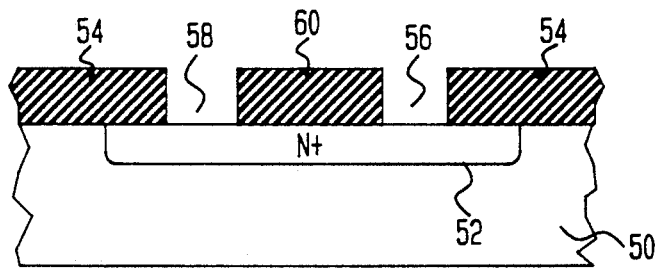

Referring now to FIG. 1C, a pair of trenches 56, 58 are then transferred through the insulation layer 54 to the N+ layer 52 in order to provide an isolation region 60. An acceptable patterning technique for forming trenches 56, 58 is to: deposit a masking layer (not shown) onto the substrate; deposit a photo resist onto the masking layer (not shown); expose the pattern through the photo resist; develop the photo resist; etch the pattern through the masking layer using a CF$_4$ RIE; remove the photo resist layer.

Figure 1D:
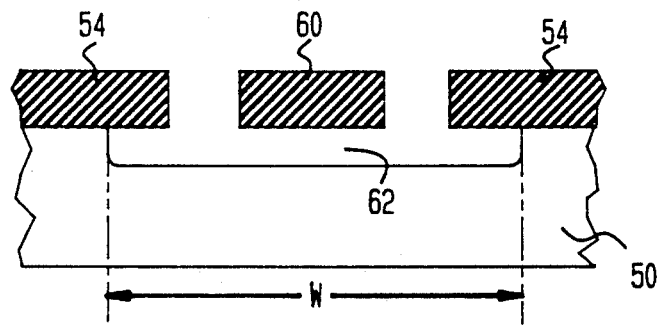

Referring now to FIG. 1D, a portion or all of the N+ layer 52 is then removed by selectively laterally etching the N+ layer 52 from below the isolation region 60, thereby forming a cavity 62 beneath and around the isolation region 60. The lateral etch utilized may be any of a number of suitable techniques well known in the art. For example, a dry plasma etch comprised of Cl$_2$ can be used to remove this N+ layer 52 and form the cavity 62 beneath the isolation region 60. The width W of the cavity 62 is dependent upon the time to which the N+ layer 52 is exposed to the dry plasma etch.

Figure 1E:
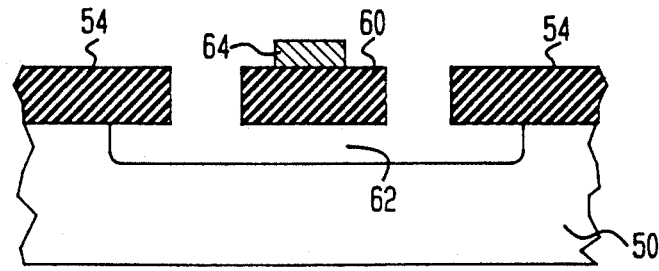

Referring now to FIG. 1E, next, a film layer 64 is formed onto isolation region 60 in a manner well known in the art, such as by CVD deposition. Film layer 64 may be any of a number of materials, such as metals or polysilicon, which are either conductive or nonconductive. The preferred embodiment of the present invention is to utilize the isolation region 60 to isolate conductive lines which are used for circuit interconnection purposes. In this case, film 64 would be comprised of a metal. However, other structures not detailed herein may also utilize the isolation region 60 for isolation from the substrate 50.

Figure 2A:
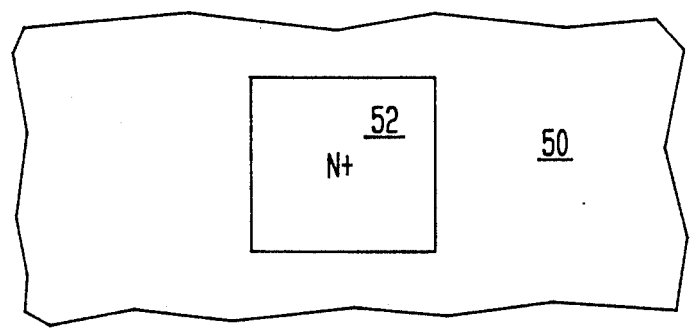
FIGS. 2A-2D are top views of the steps for producing an isolated film in accordance with the present invention.

Referring now to FIG. 2A, a top view of the process for providing an isolated film in accordance with the present invention shows the substrate 50 and the N+ doped layer 52.

Figure 2B:
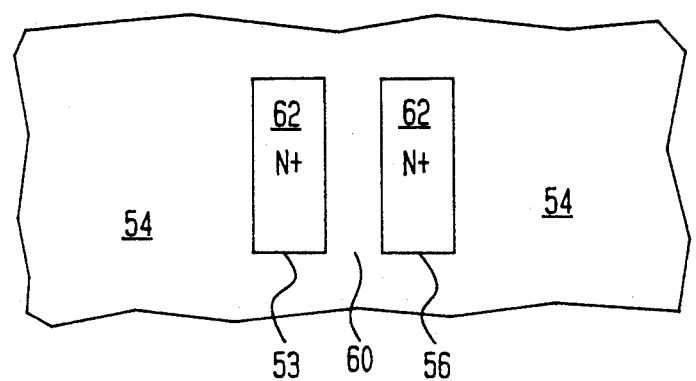

Referring now to FIG. 2B, an insulation layer 54 is then formed over the substrate 50. Two trenches 56, 58 are then etched through the insulation layer 54 to the N+ doped layer 52 to thereby provide an isolation region 60.

Figure 2C:
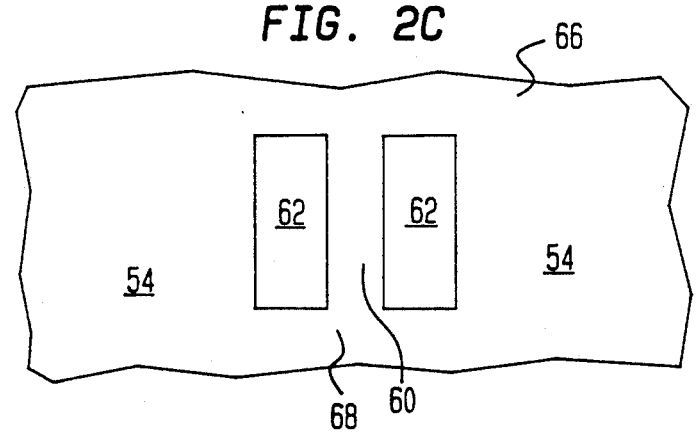

Referring now to FIG. 2C, next, the N+ layer 52 below isolation region 60 is etched away using a lateral etch as previously described before for the process as shown in FIG. 1D to thereby isolate isolation region 60 by air in the cavity 62 thus produced. It is to be noted that isolation region 60 forms a bridge over the cavity 62 by virtue of the fact that it is attached to the rest of the insulation layer 54 at each end 66, 68 of the isolation region 60.

Figure 2D:
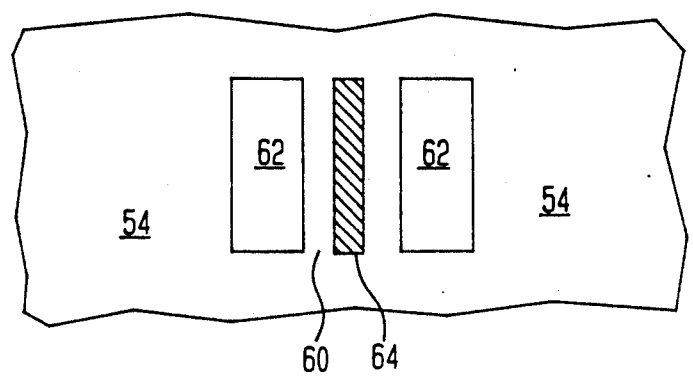

Referring now to FIG. 2D, next, a film layer 64 is formed onto the isolation region 60. If this film layer 64 is a conductor, it may be utilized as an interconnect between different devices built onto the substrate 50 or may be utilized in a other interconnection schemes not described herein, but known to those skilled in the art. It is to be noted that the film layer 64 is completely isolated from the substrate 50 by the isolation region 60 and the air cavity 62 and is not subject to the thermal stresses which prior films were susceptible to.

It is also to be noted that different patterned shapes and configurations and different etching techniques can be utilized to produce a multitude of different types of isolation regions. The particular shapes of each isolation region is not critical to the present invention.

Although the invention has been shown and described with exemplary embodiments thereof, it should be understood by those skilled in the art that the foregoing and various other changes, omissions and additions may be made therein and thereto without department from the spirit and scope of the invention.

We claim:

1. A method for isolating a film from a substrate comprising the steps of:
    a) providing an insulation layer of an insulation material on the substrate;
    b) etching i) insulation material along two sides of a desired region of said insulation layer and ii) a portion of the substrate beneath said desired region to thereby form an air cavity, said cavity completely separating said desired region of said insulation layer from the substrate beneath and from insulation material adjacent to said two sides of said desired region; and,
    c) forming the film onto said desired region of said insulation layer, wherein said desired region of said insulation layer forms a bridge under said film and thereby supports said film so that said film is isolated from the substrate by said desired region and said air cavity.

2. A method for isolating a film from a substrate according to claim 1, further wherein the step of etching further comprises etching i) insulation material along two sides of a plurality of desired regions, respectively, and ii) a portion of the substrate beneath said plurality of desired regions, respectively, to thereby form a plurality of air cavities, respectively, said cavities completely separating said plurality of desired regions of said insulation layer from the substrate beneath and from insulation material adjacent to said respective two sides of said plurality of desired regions, and further wherein the step of forming the film further comprises forming the film onto said plurality of desired regions, respectively.

3. A method for isolating a film from a substrate according to claim 1 or 2, wherein said film is comprises of an electrical conductor.

4. A method for isolating a film from a substrate according to claim 1 or 2, wherein said etching step is comprises of a dry plasma etch.

5. A method for isolating a film from a substrate comprising the steps of:
    a) providing a selective etch layer on the substrate having a characteristic etch response different from that of the substrate;
    b) forming an insulation layer of an insulation material onto said selective etch layer;
    c) forming a pair of trenches in said insulation layer, said pair of trenches further being in contact with said selective etch layer, thereby defining an isolation region in said insulation layer positioned between the trenches;
    d) laterally etching said selective etch layer under said isolation region to thereby form an air cavity, said air cavity being defined by the trenches and the etched selective etch layer underneath said isolation region; and,
    e) forming the film onto said isolation region, wherein said isolation region forms a bridge underneath the film for support thereof and the film is isolated from the substrate by said isolation region and said air cavity.

6. A method for isolating a film from a substrate according to claim 5, further wherein the step of forming a pair of trenches further comprises forming a plurality of pairs of trenches, thereby defining a plurality of isolation regions, respectively, and wherein the step of laterally etching said selective etch layer further comprises laterally etching said selective etch layer under said plurality of isolation regions, respectively, to thereby form a plurality of air cavities, respectively, said cavities completely separating said plurality of isolation regions from the substrate beneath and from insulation material adjacent to respective trench sides of said plurality of isolation regions, and wherein the step of forming the film further comprises forming the film onto said plurality of isolation regions, respectively.

7. A method for isolating a film from a substrate according to claim 5 or 6, wherein said etching step is comprised of a dry plasma etch.

8. A method for isolating a film form a substrate according to claim 5 or 6, wherein said insulation material is comprised of an oxide.

9. A method for isolating a film from a substrate according to claim 5 or 6, wherein said film is comprised of an electrical conductor.

* * * * *